(12) United States Patent  (10) Patent No.: US 8,379,440 B2
Altounian  (45) Date of Patent: Feb. 19, 2013

(54) METALLIC-GLASS-BASED PHASE-CHANGE MEMORY

(75) Inventor: Zaven Altounian, Pointe Claire (CA)

(73) Assignee: The Royal Institution for the Advancement of Learning/McGill University, Montreal, QC (CA)

(*) Notice: Subject to any disclaimer, the term of this patent is extended or adjusted under 35 U.S.C. 154(b) by 306 days.

(21) Appl. No.: 12/769,936

(22) Filed: Apr. 29, 2010

(65) Prior Publication Data

US 2010/0277973 A1   Nov. 4, 2010

Related U.S. Application Data

(60) Provisional application No. 61/174,535, filed on May 1, 2009.

(51) Int. Cl.
*G11C 11/00* (2006.01)

(52) U.S. Cl. ............ 365/163; 365/148; 365/153; 257/2; 257/3; 257/4; 257/5

(58) Field of Classification Search .................. 365/163, 365/148, 153; 257/2, 3, 4, 5
See application file for complete search history.

(56) References Cited

U.S. PATENT DOCUMENTS

| | | | | |
|---|---|---|---|---|
| 5,348,783 | A * | 9/1994 | Ohno et al. | 428/64.5 |
| 7,227,170 | B2 * | 6/2007 | Ovshinsky | 257/2 |
| 7,483,293 | B2 * | 1/2009 | Pinnow et al. | 365/163 |
| 7,623,401 | B2 * | 11/2009 | Philipp et al. | 365/222 |
| 7,706,167 | B2 * | 4/2010 | Toda et al. | 365/148 |
| 7,718,464 | B2 * | 5/2010 | Zaidi | 438/95 |
| 8,026,503 | B2 * | 9/2011 | Tu | 257/3 |
| 2008/0137396 | A1 * | 6/2008 | Philipp | 365/148 |
| 2010/0258776 | A1 * | 10/2010 | Li | 257/2 |

* cited by examiner

*Primary Examiner* — Connie Yoha

(57) ABSTRACT

A phase-change material for use in a phase-change memory device is provided. The phase-change material includes at least one metal and is reversibly phase-changeable, switchable, to a detectable metallic glass state or to a detectable crystalline state thereof. There is also provided a phase-change memory, that includes at least one phase change memory cell comprising the phase change material whereby the phase-change material and thereby the phase-change memory cell is reversibly programmable to one of these states. A method of fabricating the phase-change memory is also provided.

26 Claims, 6 Drawing Sheets

METALLIC-GLASS-BASED PHASE-CHANGE MEMORY

CROSS REFERENCE TO RELATED APPLICATIONS

This application claims benefit from the U.S. Provisional Patent Application Ser. No. 61/174,535 filed May 1, 2009 entitled "Metallic-Glass-Based Phase-Change Memory".

FIELD OF THE INVENTION

The present invention relates to the field of data memory. More particularly, the present invention relates to metallic-glass-based phase-change memory.

BACKGROUND OF THE INVENTION

Digital data memory technology plays an important role in the information industry. In general, memory is divided into two types: volatile and non-volatile. Volatile memory requires power to maintain the stored information and is therefore suitable as primary temporary storage, whereas non-volatile memory can stably retain the stored information even when the memory is not powered and is suitable for use as secondary more permanent storage. Volatile memory includes conventional random-access memory (RAM)—static RAM (SRAM), and dynamic RAM (DRAM). Non-volatile memory includes ferromagnetic RAM (FeRAM), magneto-resistive RAM (MRAM), and flash memory.

Flash memory is a non-volatile memory, the contents of which may be electrically erased and rewritten. It is widely used to provide robust data storage in small devices, for example in memory cards and USB flash drives for general storage and transfer of data. As storage and write-and-erase speed requirements increase and the size of devices decreases, limitations in flash memory performance call for a replacement technology.

Phase-change memory (PCM) is a possible replacement technology. Like flash memory, phase-change memory, also referred to as phase-change random access memory (PRAM), is non-volatile; once switched, i.e. programmed, it remains stable in that state until it is switched again.

Phase-change memory exploits changes in the physical state of a phase-change material of the phase-change memory. The data storage mechanism of phase-change memory, as the name suggests, depends on a reversible and detectable phase change in the phase-change material—for example a change from an amorphous state to a crystalline state. In an amorphous state, the arrangement of the constituent atoms in the material exhibits no long-range order. In contrast, in a crystalline state the constituent atoms are arranged in an orderly repeating pattern.

Because each physical state has measurable distinct properties, for example distinct electrical properties such as resistivity or distinct optical properties such as index of refraction, phase-change material may be used in PCM cells to store bits of data. A PCM element in the amorphous state, characterized by its high resistivity state, may represent a logic "0" data bit value whereas a PCM element in the crystalline state, characterized by its low resistivity state, may represent a logic "1" data bit value. The phase-change memory can be switched between the amorphous state and the crystalline state reliably through heat. For example, intense heat of short duration is used to melt the phase-change material in a given spot. When the intense heat is stopped the temperature drops so quickly that the atoms freeze in an amorphous state before they can arrange themselves in a crystalline state. To switch back to the crystalline state, less-intense heat of longer duration is used to heat the amorphous area of the material without melting thereby allowing the atoms to rearrange themselves into a crystalline state. To read the recorded, programmed information, a probe may be used to measure the electrical resistivity of the area of material. The high resistivity measurement of the amorphous state is read as a binary "0" whereas the low resistivity measurement of the crystalline state is read as a binary "1".

With PCM, data may be rewritten, re-programmed, without the need of a separate erase step and can exhibit write rates comparable to SRAM and DRAM. Novel faster computer memory architecture that eliminates the use of multiple tiers of system memory may also be possible with PCM.

To date, PCM technology uses chalcogenide-based phase-change material. A chalcogenide is a bronze alloy, an alloy that contains an element from the oxygen/sulphur family (old Group IVA, new Group 16) of the Periodic Table. The chalcogenide-based PCM material most commonly used is an alloy of germanium (Ge), antimony (Sb) and tellurium (Te), $Ge_2Sb_2Te_5$ referred to as GST. Chalcogenide-based PCM materials generally exhibit a two to three orders of magnitude difference in resistivity between the amorphous state and the crystalline state. Unfortunately, this large difference in resistivity between the two states requires a correspondingly large electric voltage, or power, to enable the phase change and switch between the two states. Moreover, the elements antimony (Sb) and tellurium (Te) are known to be toxic and the manufacture of chalcogenide-based phase-change material requires special handling and disposal of these elements.

There is therefore a need for PCM that is non-volatile, requires low power, and provides high capacity memory with fast programmable rates.

SUMMARY OF THE INVENTION

In accordance with an aspect of the present invention, there is therefore provided a phase-change material comprising at least one metal and where the phase-change material is reversibly programmable to a detectable metallic glass state and a crystalline state.

The metallic glass state and the crystalline state of the phase-change material may each exhibit a distinct detectable physical property thereof. In accordance with one embodiment, the metallic glass state and the crystalline state of the phase-change material may each exhibit a distinct detectable electrical resistivity.

The phase-change material may include a metallic alloy. The metallic alloy may be zirconium-based, aluminum-based, or rare-earth-based. The phase-change material may include a transition metal, such as iron (Fe), cobalt (Co), nickel (Ni), copper (Cu) or mixtures or alloys thereof.

In accordance with another aspect of the present invention, there is provided a is phase-change memory that includes a phase-change memory cell comprising a phase-change material reversibly programmable to a detectable metallic glass state and a crystalline state, as described above.

The phase-change material may be programmable in response to an optical or electrical signal.

The phase-change memory cell may include programming means for programming the phase-change memory cell to the metallic glass state or the crystalline state. In accordance with one embodiment, the programming means may include: contacts to the phase-change material for delivering a signal to at least a portion of the phase-change material.

In accordance with another aspect of the present invention, there is provided a method of fabricating a phase-change memory that includes: fabricating a phase-change memory cell comprising a phase-change material, the phase-change material being reversibly programmable to a metallic glass state and a crystalline state; and providing programming means for programming the phase-change memory cell to the metallic glass state or the crystalline state.

In accordance with one embodiment, providing the programming means may include: providing electrical contacts to the phase-change material for delivering an electrical signal to at least a portion of the phase-change material.

The phase-change material may include a zirconium-based, aluminum-based, or rare-earth-based metallic alloy. It may include a transition metal.

Other features and advantages of the present invention will be better understood upon reading of the description hereinbelow with reference to the appended drawings.

DESCRIPTION OF THE INVENTION

Figure 1A:
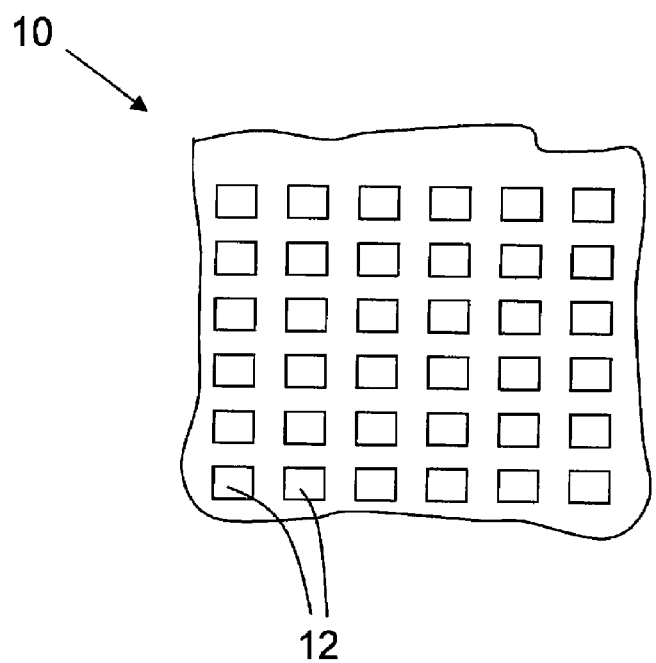
FIG. 1(a) is a top view schematic diagram phase-change memory showing an array of memory cells.

The aspects of the present invention will be described more fully hereinafter with reference to the accompanying drawings.

To improve upon the switching, i.e. programming, rate of the chalcogenide-based prior art PCM, phase-change materials that exhibit fast and reversible phase changes are needed.

As mentioned, the data storage mechanism of PCM depends on a reversible structural phase change in the phase-change material from the amorphous state to a crystalline state. The crystalline state of the phase-change material is characterized by a highly ordered arrangement of atoms whereas in contrast the amorphous state is characterized by a highly disordered long-range atomic structure. When a liquid material is cooled very rapidly, it does not crystallize into its crystalline state but rather bypasses the crystalline state and supercools into an amorphous state, referred to as a "glass" state. Materials in which an amorphous structure is produced upon supercooling from the liquid state are called "glasses".

The glass phase transformation in metallic material is generally more rapid than in oxides or chalcogenides.

To take advantage of this rapid glass phase transformation, there is provided a phase-change material in accordance with an aspect of the present invention that comprises at least one metal and is reversibly programmable to a detectable metallic glass state and a crystalline state. That is to say, the phase change material is reversibly phase-changeable, reversibly switchable between states. For example, a phase change from the metallic glass state to a crystalline state is reversible and vice versa.

The phase-change material may include a transition metal element, such as iron (Fe), cobalt (Co), nickel (Ni), copper (Cu), or mixtures or alloys thereof.

The phase-change material may include a metallic alloy. An alloy is a partial or complete solid solution of one or more elements in a metallic structure. Complete to solid solution alloys give single solid phase microstructure, while partial solutions give two or more phases that may be homogeneous in distribution depending on the heat treatment. Alloys usually have different properties from those of the component elements.

The metallic alloy may be zirconium-based (Zr-based), aluminum-based (Al-based), or rare-earth-based (RE-based). Preferably, the phase-change material includes a Zr-based alloy because Zr-based alloys show good glass forming ability and a relatively low glass-crystalline phase-change temperature.

To facilitate the reversibility of the amorphous-crystallization phase change, the phase-change material may include a metallic alloy of eutectic composition. A eutectic alloy is one for which the melting point is as low as possible and all the constituents of the alloy crystallize simultaneously at this temperature from the liquid state. With a non-eutectic alloy, one component of the alloy crystallizes at one temperature and the other at a different temperature. With a eutectic alloy, all of the components of the alloy crystallize as one at a single temperature. A eutectic alloy therefore has a sharp melting point, and a non-eutectic alloy exhibits a plastic melting range. A lower melting temperature translates to a lower input energy requirement to initiate a phase change in the phase-change material from the crystallization state to the amorphous state, that is to say, to switch to or program the glass state.

The properties of the phase-change material may be tailored by using one or more dopants. It is possible for the phase-change material to include impurities; however, its purity should be consistent with the operation requirements of the PCM device. Impurities present in the phase-change material may include elements naturally present in the raw material, processing contaminants which may be introduced into the material during processing, or oxides due to oxidation of the metallic phase change material. High levels of impurities in the phase-change material can lead to uneven crystallization of the material and/or to an inhomogeneous crystalline state due to local crystallization about impurity sites which act as nucleation sites for crystal grain growth.

The glass state and the crystalline state of the metallic phase-change material each exhibit a distinct detectable physical property thereof. For example, they may exhibit a distinct detectable electrical property such as resistivity or a distinct optical property such as index of refraction. Another important advantage in using metal alloys in PCM devices is the relatively low resistivity of the amorphous state as compared to that of chalcogenides, and thus the lower electric voltage/power required to enable the amorphous-crystallization phase change.

In accordance with another aspect of the present invention, there is provided a phase-change memory that includes at least one phase change memory cell comprising a phase change material. The phase change material includes at least one metal and is reversibly phase-changeable, switchable, to a detectable metallic glass state or to a detectable crystalline state thereof, and whereby the phase-change material and thereby the phase-change memory cell is reversibly programmable to one of these states.

As illustrated by way of a non-limiting example in FIG. 1(a), the phase-change memory (PCM) 10 of the present invention may include several memory cells 12 arranged in rows and columns forming a two-dimensional or three-dimensional array, each memory cell 12 including the phase-change memory material.

The phase-change memory is preferably "non-volatile". As used herein "non-volatile" means that the phase-change material will maintain the integrity (within a selected margin of error) of the programmed state. Hence, the programmed state and corresponding detectable property (e.g. the set resistivity value) can remain constant for archival time periods without losing the integrity of the information stored therein.

In one embodiment of the present invention, the phase-change material has two to detectable electrical resistivity values. This allows for each memory cell to have binary storage capabilities. In another embodiment of the present invention, the phase-change material has three or more detectable electrical resistivity values. This provides for a memory cell having multibit storage capabilities.

Each memory cell may include a layer of phase-change memory material. This layer is preferably of a thickness that allows for a uniform and rapid transformation of the phase-change material from one state to the other. Preferably the phase-change material is of a thickness ranging from about 10 nm to 500 nm, and more preferably from about 10 nm to 100 nm.

The phase-change memory material may be fabricated by any appropriate method such as sputtering, evaporation, molecular beam expitaxy or by chemical vapor deposition (CVD), which may be enhanced by plasma techniques. The phase-change memory material is preferably made by RF sputtering or ion-beam evaporation. As well, substrate heating may be used to control the morphology of the phase-change material by affecting crystal growth as well as crystal aggregation via surface mobility.

The phase-change material may be programmable in response to an optical signal or an electrical signal. The optical signal may be a laser beam of electromagnetic radiation, the electromagnetic radiation not being limited to the visible portion of the electromagnetic spectrum. The electrical signal may be an electric current or electric voltage. The electric current may consist of a flow of electrons, protons, positive ions, negative ions, or any other type of charged particle.

The phase-change memory cell may include programming means for programming the phase-change memory cell to the metallic glass state or the crystalline state. The programming means may include contacts to the phase-change material for delivering a signal to at least a portion of the phase-change material.

Figure 1B:
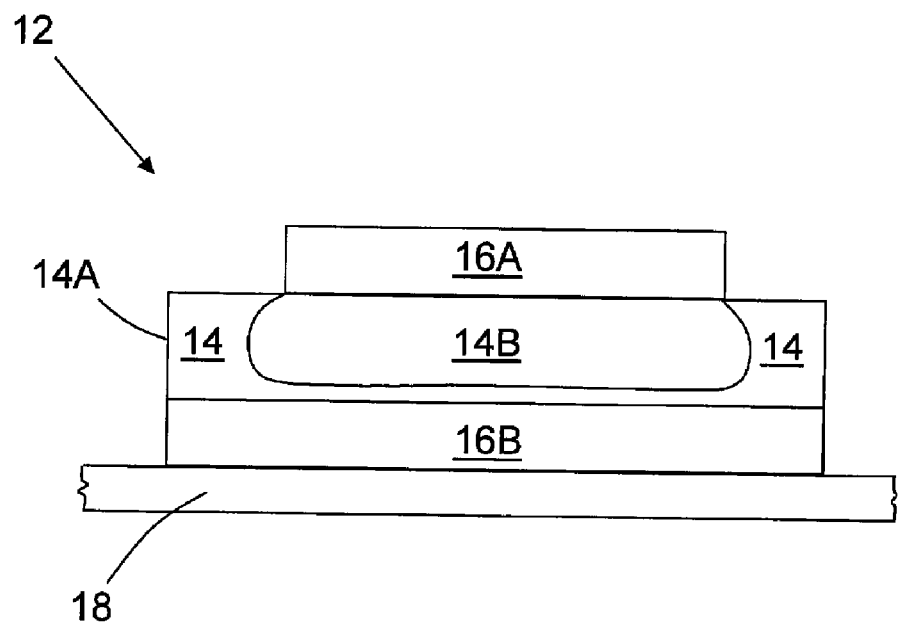
FIG. 1(b) is a cross-sectional diagram of a phase-change memory cell comprising a phase-change material.

A non-limitative embodiment of a phase-change memory cell according to the present invention is illustrated by way of example in FIG. 1(b). FIG. 1(b) shows a cross-sectional view of an embodiment of the phase-change memory cell 12 formed on a silicon semiconductor wafer 18. The memory cell 12 includes a layer 14A of phase-change material 14, a first electric contact 16A and a second electric contact 16B spacedly disposed on the phase-change memory material 14, each of the contacts 16A and 16B being made of an appropriate material. An electric signal is delivered to at least a portion 14B of the phase-change material 14. This may be done, for example, via an electric current that is made to flow between the two contacts 16A and 16B. To program the phase-change material 14 to the metallic glass state, the electric current heats the phase-change material 14 to a temperature equal to or greater than the melting temperature and the phase-change material 14 is then cooled rapidly into the metallic glass state. To program the phase-change material 14 to the crystalline state, the phase-change material 14 of the memory cell 12 is heated to a temperature of at least the crystallization temperature of the crystalline state and then cooled slowly so that the phase-change material 14 recrystallizes into the selected crystalline state. The phase change in the phase-change material 14 of the memory cell 12 may be induced reversibly, and the memory cell 12 may be reversibly switched from the glass state to the crystalline state.

Of course, the programming of the memory cell into the selected state, that is to say controllably heating the phase-change material to induce controllable phase change therein, may be carried out in a variety of ways: for example, a laser can be directed to the phase-change material, current or voltage may be driven through the phase change material, or current or voltage can be fed through a resistive heater adjacent the phase change material.

Not all of the phase-change material in the memory cell need undergo the phase change, as mentioned hereinabove. At least a portion of the phase-change material, the programming region, needs to be transformed; enough of the material needs to be transformed, or switched, so as the state to be detectable. Moreover, the crystalline state need not be of a homogeneous crystalline phase or composition. The phase-change material should be able to undergo a phase change from an amorphous state to a crystalline state and the two states should be detectably distinct.

Exemplary embodiments of phase-change materials are provided in the following examples. These examples are presented by way of illustration and are not intended in any way to otherwise limit the scope of the invention.

EXAMPLES

Because Zr-based alloys exhibit good glass forming ability and a relatively low glass-crystalline phase-change temperature, two phase-change materials each consisting of a copper-zirconium (Cu—Zr) alloy were examined. The two Cu—Zr alloy compositions are each a eutectic composition so as to facilitate the amorphization-crystallization transformation; the lower melting temperature aiding to reset the amorphous, glass, state. The two phase-change materials were prepared in the amorphous state, crystallized and the electrical resistivities were compared.

Technical Details

Thin films with nominal composition $Cu_{64}Zr_{36}$ and $Cu_{46}Zr_{54}$ were prepared by magnetron-sputter co-deposition under a clean room environment. [It should be noted that the composition $Cu_{64}Zr_{36}$ may be represented by either the formula $Cu_{64}Zr_{36}$ or the formula $Zr_{36}Cu_{64}$ and both formulae may be used interchangeably herein. Similarly, the composition $Cu_{46}Zr_{54}$ may be represented by either the formula $Cu_{46}Zr_{54}$ or the formula $Zr_{54}Cu_{46}$ and both formulae may be used interchangeably herein.] All the depositions were performed in a multi-target magnetron-sputtering (Denton) system with an argon pressure of 5 mTorr. Silicon (Si) substrates with a very thin layer of amorphous $SiO_2$ (10 angstrom) were used. The composition of the two thin films was calculated by measuring deposition rates separately for Zr and Cu. The typical power at the Zr target was about 325 W is while the power at Cu target varied from 70 W to 160 W to adjust the Cu content in the Cu—Zr thin films. All of the deposited thin films had a thickness of about 1000 nm.

The as-deposited thin films were annealed in a vacuum furnace with a pressure less than $5\times10^{-3}$ Pa. In general, annealing involves heating the material to above the crystallization temperature, maintaining a suitable temperature, and then cooling. The structures for the as-deposited and annealed samples were studied by x-ray powder diffraction (XRD) using Cu $K_\alpha$ radiation in an automated Nicolet x-ray diffractometer.

The electric resistances of the as-deposited and annealed thin films were measured using the Van de Pauw four probe method. All of the samples had a size of about 10 cm×10 cm. The contact resistances were about 20 Ohm. The measurements were performed in a LR-400 Four Wire AC Bridge (Linear Research Inc.).

Results (A) Structure of the as-Prepared and Annealed Cu—Zr Thin Films

Figure 2A:
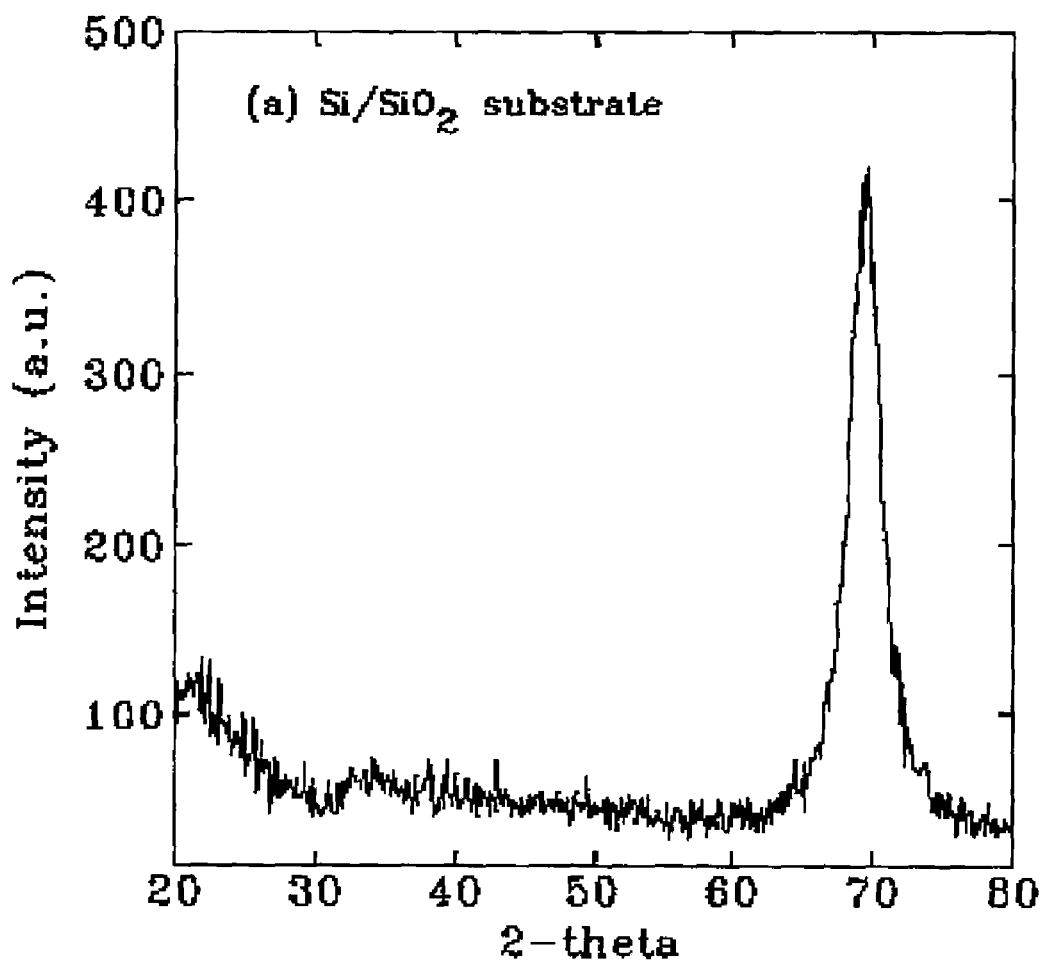
FIG. 2(a) is an x-ray powder diffractogram of a $Si/SiO_2$ substrate.
Figure 2B:
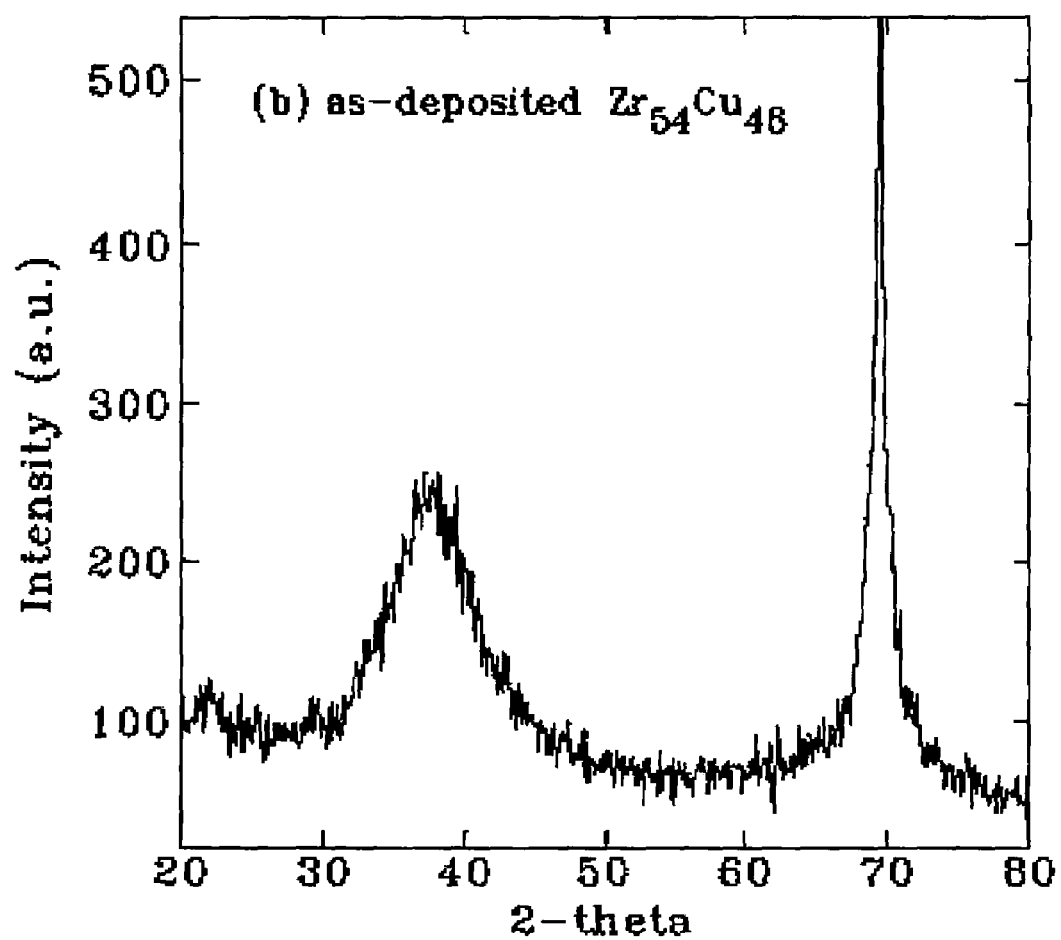
FIG. 2(b) is an x-ray powder diffractogram of as-deposited amorphous $Zr_{54}Cu_{46}$ thin film.
Figure 2C:
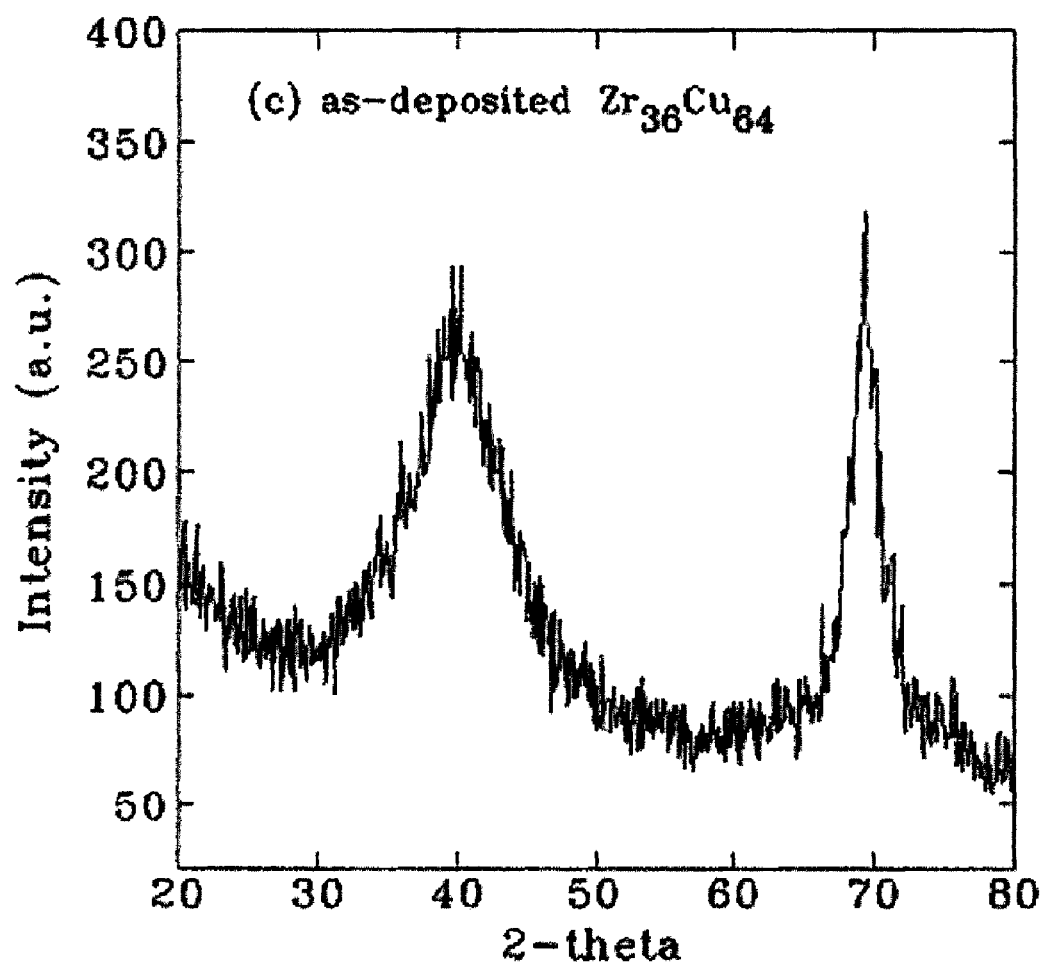
FIG. 2(c) is an x-ray powder diffractogram of as-deposited amorphous $Zr_{36}Cu_{64}$ thin film.

All of the as-prepared thin film Cu—Zr samples had a typical amorphous structure. The x-ray diffractograms obtained for the $SiO_2$ substrate and the $Cu_{64}Zr_{36}$ and $Cu_{46}Zr_{54}$ amorphous thin films are shown in FIGS. 2(a) to (c). The broad peaks at a 2-theta of 40° indicate the amorphous nature of the structure while the sharp peak at a 2-theta of 70° corresponds to the Si (004) diffraction peak characteristic of the $SiO_2$ substrate. These results indicate that amorphous Cu—Zr alloys could be successfully prepared under the present conditions.

Figure 3:
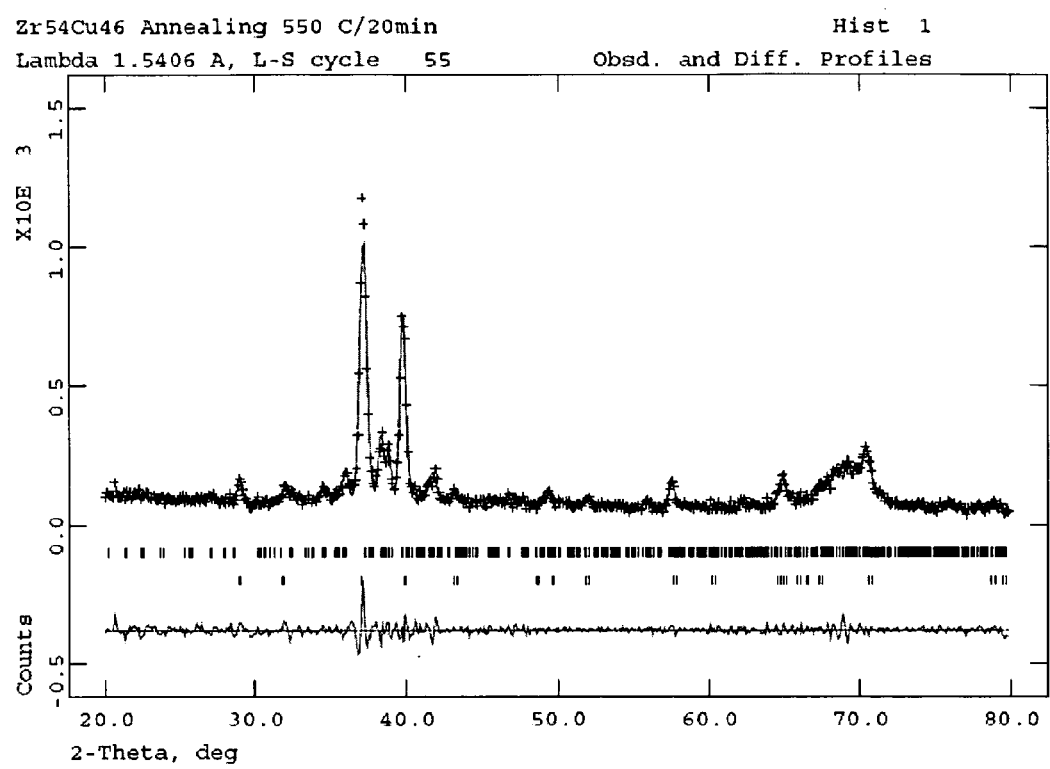
FIG. 3 is an x-ray powder diffractogram of a $Zr_{54}Cu_{46}$ thin film after annealing at 823K for 20 min, showing the presence of component crystalline $CuZr_2$ and $Cu_{10}Zr_7$ phases.
Figure 4:
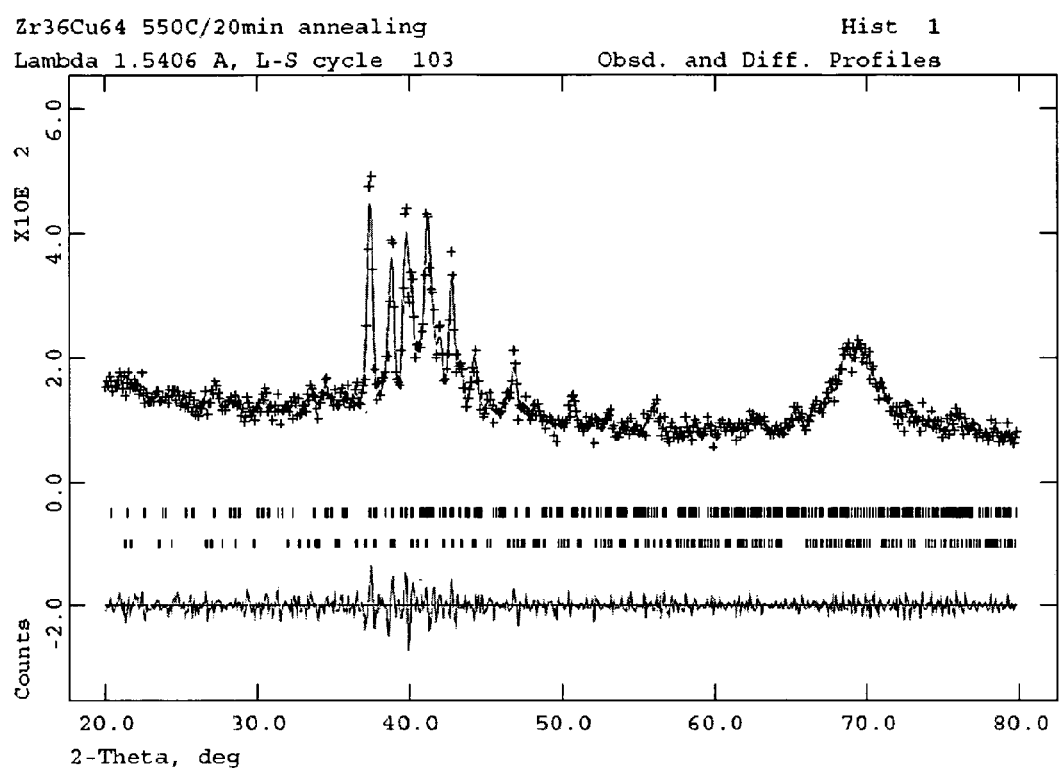
FIG. 4 is an x-ray powder diffractogram of a $Zr_{36}Cu_{64}$ thin film after annealing at 823K for 20 min, showing the presence of component crystalline $Cu_{51}Zr_{14}$ and $Cu_{10}Zr_7$ phases.

Upon annealing of the two as-deposited amorphous Cu—Zr films, the Cu—Zr material is expected to crystallize. The two thin films were annealed at 823 K (550° C.) for 20 minutes. FIGS. 3 and 4 show the x-ray diffractograms obtained is for the annealed $Cu_{46}Zr_{54}$ and $Cu_{64}Zr_{36}$ thin films, respectively. X-ray diffraction (XRD) pattern obtained for the annealed $Cu_{46}Zr_{54}$ reveals, as expected, two crystalline products: orthorhombic $Cu_{10}Zr_7$ and tetragonal $CuZr_2$. On the other hand, X-ray diffraction (XRD) patterns obtained for the annealed $Cu_{64}Zr_{36}$ thin film reveals the following two crystalline products: $Cu_{10}Zr_7$ and $Cu_{51}Zr_{14}$. Broad x-ray diffraction peaks indicate fine crystal grains in the alloys.

(B) Electric Resistivity of the as-Prepared and Annealed Cu—Zr Thin Films

The electric resistances for as-deposited and annealed Cu—Zr thin films were measured using the van de Pauw four-probe AC bridge method. The results are listed in Table 1.

TABLE 1

Electric resistance for Zr—Cu Amorphous and crystallized alloys

| Samples | Annealing Temperature (K) | State | $\rho$ ($\pm 1$ $\mu\Omega \cdot$ cm) |
|---|---|---|---|
| $Cu_{46}Zr_{54}$ (#1) | — | Amorphous | 111 |
| $Cu_{46}Zr_{54}$ (#1) | 773 | Crystalline | 93 |
| $Cu_{46}Zr_{54}$ (#2) | — | Amorphous | 98 |
| $Cu_{46}Zr_{54}$ (#2) | 823 | Crystalline | 47 |
| $Cu_{46}Zr_{54}$ (#2) | 823 | Crystalline | 52 |
| $Cu_{64}Zr_{36}$ | — | Amorphous | 98 |
| $Cu_{64}Zr_{36}$ | — | Amorphous | 102 |
| $Cu_{64}Zr_{36}$ | 823 | Crystalline | 89 |

The resistivity of all of the as-deposited amorphous Cu—Zr thin films is about 100 $\mu\Omega$·cm and is higher than that of their crystalline counterparts. Although the crystallized Cu—Zr thin films all exhibit a relatively lower electric resistivity, the exact value of the resistivity depends on the crystallized products. The electric resistivity for the $Cu_{46}Zr_{54}$ thin film annealed for 20 minutes at 773 K (500° C.) is clearly higher than for the same $Cu_{46}Zr_{54}$ thin film annealed for 20 minutes at 823 K (550° C.). This is due to the existence of some amorphous regions as well as some nano-sized grains in the crystallized regions in the film annealed at 773 K, in contrast to the film annealed at 823 K which is completely crystallized. The more important result, however, is the fact that the change in resistance is about 50% for the amorphous-crystalline phase change in the $Cu_{46}Zr_{54}$ film while the corresponding change for the $Cu_{64}Zr_{36}$ film is only about 10%. These results are related to the microstructural differences in the two compositions. Therefore, the amorphous-crystalline phase change in the $Cu_{46}Zr_{54}$ film is more easily detected allowing for accurate reading of a memory cell comprising such a material.

(c) Remarks

In summary, it has been demonstrated that:
the Zr—Cu thin film with amorphous structures could successfully be prepared using the magnetron co-sputtering technique; and
the change in electric resistivity for the amorphous and crystallized $Cu_{46}Zr_{54}$ thin films is about a factor of 2 which is sufficient for detection.

One other important consideration is the low voltages required for the phase change in these metallic alloys, as compared to chalcogenides, owing to the low resistivity of these metallic alloys.

Through appropriate choice of metallic glass it is possible to:

(i) increase the difference in the resistivity between the states;
(ii) change the temperature of crystallization;
(iii) change the melting temperature of the alloy;
(iv) decrease the time required to switch between the two states (i.e decrease switching/programming time);
(v) increase the number of read-write cycles.

Numerous modifications could be made to any of the embodiments described above without departing from the scope of the present invention.

The invention claimed is:

1. A phase-change material for use in a phase-change memory device, said phase-change material being essentially a non-chalogenide-based phase-change material and comprising at least one metal and being reversibly phase-changeable to a detectable metallic glass state and at least one detectable crystalline state thereof.

2. A phase-change material according to claim 1, wherein said phase change material comprises two or more detectable crystalline states.

3. A phase-change material according to claim 1, wherein said detectable metallic glass state and said at least one detectable crystalline state each exhibit a distinct detectable physical property thereof.

4. A phase-change material according to claim 3, wherein said distinct detectable physical property is an electrical property.

5. A phase-change material according to claim 4, wherein said electrical property is an electrical resistivity.

6. A phase-change material according to claim 3, wherein said distinct detectable physical property is an optical property.

7. A phase-change material according to claim 1, wherein said metal is a transition metal.

8. A phase-change material according to claim 1, wherein said metal is Fe, Co, Ni, Cu, Zr or Al.

9. A phase-change material according to claim 1, comprising a metallic alloy.

10. A phase-change material according to claim 9, wherein said metallic alloy is a eutectic alloy.

11. A phase-change material according to claim 1, comprising a rare earth element.

12. A phase-change memory, said phase-change memory comprising at least one phase-change memory cell comprising a phase-change material, said phase change material being essentially a non-chalogenide-based phase-change material and comprising at least one metal and being reversibly phase-changeable to a detectable metallic glass state and at least one detectable crystalline state thereof, and whereby said phase-change material and thereby said phase-change memory cell is reversibly programmable to said detectable metallic glass state and said at least one detectable crystalline state.

13. A phase-change memory according to claim 12, wherein said phase-change material comprises two or more detectable crystalline states.

14. A phase-change memory according to claim 12, wherein said detectable metallic glass state and said at least one detectable crystalline state of said phase-change material each exhibit a distinct detectable physical property thereof.

15. A phase-change memory according to claim 14, wherein said distinct detectable physical property is an electrical property.

16. A phase-change memory according to claim 15, wherein said electrical property is an electrical resistivity.

17. A phase-change memory according to claim 14, wherein said distinct detectable physical property is an optical property.

18. A phase-change memory according to claim 12, comprising more than one memory cell arranged in an array.

19. A phase-change memory according to claim 12, comprising programming means for programming said phase-change memory cell to said detectable metallic glass state or said at least one detectable crystalline state.

20. A phase-change memory according to claim 19, wherein said programming means comprises contacts to said phase-change material for delivering a signal to at least a portion of said phase-change material.

21. A method of fabricating a phase-change memory comprising:

fabricating at least one phase-change memory cell comprising a phase-change material, said phase change material being essentially a non-chalogenide-based phase-change material and comprising at least one metal and being reversibly phase-changeable to a detectable metallic glass state and at least one detectable crystalline state thereof, and whereby said phase-change material and thereby said at least one phase-change memory cell is reversibly programmable to said detectable metallic glass state and said at least one detectable crystalline state.

22. A method of fabricating a phase-change memory according to claim 21, further comprising providing programming means for programming said at least one phase-change memory cell to said detectable metallic glass state or said at least one detectable crystalline state.

23. A method of fabricating a phase-change memory according to claim 22, wherein said providing programming means comprises providing means for delivering an optical signal or electrical signal to said phase-change material of said phase-change memory cell.

24. A method of fabricating a phase-change memory according to claim 22, wherein said providing programming means comprises providing contacts to said phase-change material for delivering a signal to at least a portion of said phase-change material.

25. A method of fabricating a phase-change memory according to claim 21, wherein said fabricating at least one phase-change memory cell comprising a phase-change material comprises fabricating a layer of said phase change material, said layer having a thickness conducive to uniform and rapid phase change of said phase-change material.

26. A method of fabricating a phase-change memory according to claim 21, wherein said fabricating at least one phase-change memory cell comprises fabricating more than one phase-change memory cell and forming an array of said more than one phase-change memory cell.

* * * * *